US009142660B2

(12) United States Patent
Guo et al.

(10) Patent No.: US 9,142,660 B2
(45) Date of Patent: Sep. 22, 2015

(54) METHOD TO FABRICATE A VERTICAL TRANSISTOR HAVING AN ASYMMETRIC GATE WITH TWO CONDUCTIVE LAYERS HAVING DIFFERENT WORK FUNCTIONS

(75) Inventors: Dechao Guo, Fishkill, NY (US); Shu-Jen Han, Cortlandt Manor, NY (US); Keith Kwong Hon Wong, Wappingers Falls, NY (US); Jun Yuan, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/611,113

(22) Filed: Sep. 12, 2012

(65) Prior Publication Data
US 2013/0095623 A1      Apr. 18, 2013

Related U.S. Application Data

(63) Continuation of application No. 13/271,812, filed on Oct. 12, 2011, now Pat. No. 8,866,214.

(51) Int. Cl.
*H01L 21/336*       (2006.01)
*H01L 29/78*        (2006.01)
(Continued)

(52) U.S. Cl.
CPC ........ *H01L 29/78* (2013.01); *H01L 21/823487* (2013.01); *H01L 21/823885* (2013.01); *H01L 29/4983* (2013.01); *H01L 29/66666* (2013.01); *H01L 29/7827* (2013.01)

(58) Field of Classification Search
CPC ............... H01L 21/823487; H01L 21/823885; H01L 27/2454; H01L 29/66272; H01L 29/66666; H01L 29/7827; H01L 29/78642; H01L 29/8083

USPC ..................................... 438/268; 257/E21.41
See application file for complete search history.

(56) References Cited

U.S. PATENT DOCUMENTS 5,483,094 A *  1/1996  Sharma et al. ................ 257/316
5,763,311 A    6/1998  Gardner et al.
(Continued)

FOREIGN PATENT DOCUMENTS

JP        7321228 A    12/1995
JP     2008172164 A     7/2008

OTHER PUBLICATIONS

Liu, H. et al., An Ultrathin Vertical Channel MOSFET for Sub-100-nm Applications, IEEE Transactions on Electron Devices, vol. 50, No. 5, May 2003.
(Continued)

*Primary Examiner* — Anh Mai
(74) *Attorney, Agent, or Firm* — Harrington & Smith (57) ABSTRACT

A transistor structure is formed to include a substrate and, overlying the substrate, a source; a drain; and a channel disposed vertically between the source and the drain. The channel is coupled to a gate conductor that surrounds the channel via a layer of gate dielectric material that surrounds the channel. The gate conductor is composed of a first electrically conductive material having a first work function that surrounds a first portion of a length of the channel and a second electrically conductive material having a second work function that surrounds a second portion of the length of the channel. A method to fabricate the transistor structure is also disclosed. The transistor structure can be characterized as being a vertical field effect transistor having an asymmetric gate.

19 Claims, 10 Drawing Sheets

(51) Int. Cl.
*H01L 21/8238* (2006.01)
*H01L 21/8234* (2006.01)
*H01L 29/49* (2006.01)
*H01L 29/66* (2006.01)

(56) References Cited

U.S. PATENT DOCUMENTS

| | | | |
|---|---|---|---|
| 5,789,298 | A | 8/1998 | Gardner et al. |
| 5,841,168 | A | 11/1998 | Gardner et al. |
| 5,963,809 | A | 10/1999 | Duane et al. |
| 6,100,123 | A | 8/2000 | Bracchitta et al. |
| 6,127,235 | A | 10/2000 | Gardner et al. |
| 6,157,061 | A * | 12/2000 | Kawata ............. 257/316 |
| 6,180,502 | B1 | 1/2001 | Liang |
| 6,300,182 | B1 | 10/2001 | Yu |
| 6,492,212 | B1 | 12/2002 | Ieong et al. |
| 6,503,786 | B2 | 1/2003 | Klodzinski |
| 6,605,845 | B1 | 8/2003 | Liang |
| 6,645,845 | B2 | 11/2003 | Schuegraf et al. |
| 6,686,245 | B1 | 2/2004 | Mathew et al. |
| 6,967,143 | B2 | 11/2005 | Mathew et al. |
| 7,018,876 | B2 | 3/2006 | Mathew et al. |
| 7,144,782 | B1 | 12/2006 | Ehrichs |
| 7,192,876 | B2 | 3/2007 | Mathew et al. |
| 7,265,413 | B2 * | 9/2007 | Hofmann et al. ............. 257/324 |
| 2003/0178689 | A1 * | 9/2003 | Maszara et al. ............. 257/407 |
| 2008/0057635 | A1 | 3/2008 | Chen |
| 2009/0032889 | A1 | 2/2009 | Zhu et al. |
| 2009/0159964 | A1 * | 6/2009 | Lee ............. 257/329 |
| 2010/0127331 | A1 * | 5/2010 | Ratnakumar et al. ......... 257/365 |
| 2010/0216289 | A1 * | 8/2010 | Park et al. ............. 438/268 |

OTHER PUBLICATIONS

Gili, E. et al., "Asymmetric Gate-Induced Drain Leakage and Body Leakage in Vertical MOSFETs with Reduced Parasitic Capacitance", IEEE Transactions on Electron Devices, vol. 53, No. 5, May 2006.

Liu et al., "Cointegration of High-Performance Tied-Gate Three-Terminal FinFETs and Variable Threshold-Voltage Independent-Gate Four-Terminal FinFETs with Asymmetric Gate-Oxide Thicknesses", IEEE Electron Device Letters, vol. 28, No. 6, Jun. 2007.

Nowak, E. et al., "Turning Silicon on Its Edge Overcoming Silicon Scaling Barriers with Double-Gate FinFET Technology", IEEE Circuits & Devices Magazine, Jan./Feb. 2004.

Huang, C et al., "Characteristics and Mechanism of Tunable Work Function Gate Electrodes Using a Bilayer Metal Structure on SiO2 and HfO2", IEEE Electron Device Letters, vol. 26, No. 7, Jul. 2005.

* cited by examiner

ID TO FABRICATE A VERTICAL
METHOD TO FABRICATE A VERTICAL TRANSISTOR HAVING AN ASYMMETRIC GATE WITH TWO CONDUCTIVE LAYERS HAVING DIFFERENT WORK FUNCTIONS

CROSS-REFERENCE TO A RELATED PATENT APPLICATION

This patent application is a continuation application of copending U.S. patent application Ser. No. 13/271,812, filed Oct. 12, 2011, the disclosure of which is incorporated by reference herein in its entirety.

TECHNICAL FIELD

The exemplary embodiments of this invention relate generally to transistor devices and, more specifically, relate to asymmetric gate vertical transistor devices and to methods of fabricating same.

BACKGROUND

An asymmetric transistor device can provide enhanced current handling and increase output resistance. However, it is difficult to fabricate an asymmetric transistor device to have a lateral structure where the gate characteristics vary in a manner that is parallel to the underlying channel.

Various vertical channel transistor devices have been previously proposed. For example, reference can be made to IEEE TRANSACTIONS ON ELECTRON DEVICES, VOL. 53, NO. 5, May 2006, Asymmetric Gate-Induced Drain Leakage and Body Leakage in Vertical MOSFETs With Reduced Parasitic Capacitance, Enrico Gili, V. Dominik Kunz, Takashi Uchino, Mohammad M. Al Hakim, C. H. de Groot, Peter Ashburn, and Stephen Hall; and to IEEE TRANSACTIONS ON ELECTRON DEVICES, VOL. 50, NO. 5, May 2003, An Ultrathin Vertical Channel MOSFET for Sub-100-nm Applications, Haitao Liu, Zhibin Xiong, and Johnny K. O. Sin. Reference can also be made to U.S. Pat. No. 6,686,245, Feb. 3, 2004, Vertical MOSFET with Asymmetric Gate Structure, Leo Mathew and Michael Sadd.

BRIEF SUMMARY

An aspect of the exemplary embodiments of this invention provides a method to fabricate a transistor structure. The method comprises providing a substrate; forming upon a surface of the substrate a source, a drain and a channel that is disposed vertically between the source and the drain; forming a gate dielectric layer over at least sidewalls of the channel; and forming a gate conductor that surrounds the channel and the gate dielectric layer. The gate conductor is formed so as to comprise a first electrically conductive material having a first work function that surrounds a first portion of a length of the channel and a second electrically conductive material having a second work function that surrounds a second portion of the length of the channel.

BRIEF DESCRIPTION OF THE SEVERAL VIEWS OF THE DRAWINGS

FIGS. 1-12 are each an enlarged cross-sectional view illustrating embodiments of this invention, where various layer thicknesses and other elements are not drawn to scale, wherein:

FIG. 1 shows an exemplary semiconductor structure that comprises a semiconductor substrate and a stack of material layers formed thereon;

FIG. 2 shows the stack of material layers after a reactive ion etch procedure is performed to form a precursor transistor structure having a channel layer disposed between source and drain layers;

FIG. 3 shows the precursor transistor structure after a spacer is formed on the sidewalls thereof;

FIG. 4 shows an optional step of performing a thermal oxidation process that forms an oxide layer over exposed material of a source region;

FIG. 5 shows the structure after removal of the spacer formed in FIG. 3;

FIG. 6 shows a result of a process to form a layer of gate dielectric;

FIG. 7 shows a result of a blanket deposition of a first metal gate conducting material layer (having a first work function) over the gate dielectric;

FIG. 8 shows a result of a selective removal of the first metal gate conducting material layer from sidewalls of the precursor transistor structure so that it at least covers and surrounds a lower portion of the channel layer;

FIG. 9 shows a result of a blanket deposition of a second metal gate conducting material layer (having a second, different work function) over the remaining first metal gate conducting material layer and over an upper exposed portion of the gate dielectric;

FIG. 10 shows a result of a performance of a chemical mechanical polish process;

FIG. 11 shows a result of metal gate recess etch process that reduces the thickness of the second metal gate conducting material layer so that it at least covers and surrounds an upper portion of the channel layer; and FIG. 12 shows an nFET transistor structure formed as a result of an undoped silicate glass process, patterning and via formation to fabricate a gate contact and a drain contact.

DETAILED DESCRIPTION

An important parameter of a MOSFET device is the effective work function ($\Phi_{\mathit{eff}}$) of the gate, which is in contact with the gate dielectric. The $\Phi_{\mathit{eff}}$ affects the device flatband voltage ($V_{fb}$) and thus controls the threshold voltage ($V_t$) of the MOSFET.

FIGS. 1-12 show the fabrication of an asymmetric gate, vertical channel transistor device, specifically an nFET 50, in accordance with exemplary embodiments of this invention.

Figure 1:
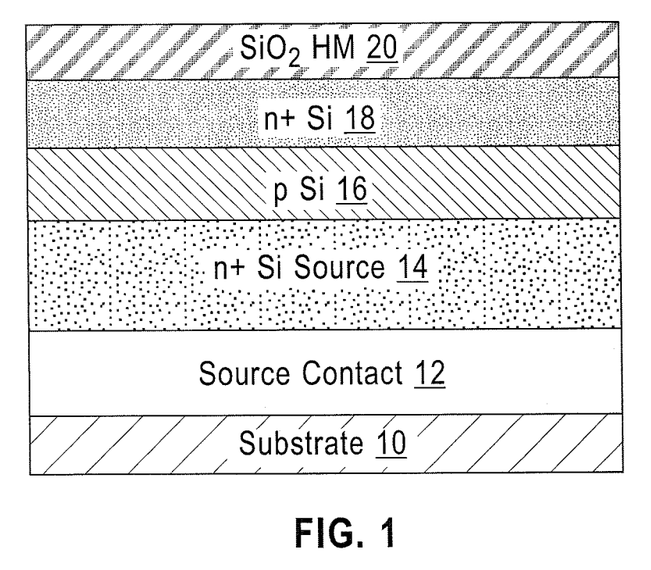

Referring to FIG. 1, an exemplary semiconductor structure according to the present invention comprises a semiconductor substrate 10 and a stack of material layers formed thereupon. The semiconductor substrate 10 has a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material of the semiconductor substrate 10 comprises silicon.

In case the semiconductor material of the semiconductor substrate 10 is a single crystalline silicon-containing semiconductor material, the single crystalline silicon-containing semiconductor material is preferably selected from single crystalline silicon, a single crystalline silicon carbon alloy, a single crystalline silicon germanium alloy, and a single crystalline silicon germanium carbon alloy.

The semiconductor material of the semiconductor substrate 10 may be appropriately doped either with p-type dopant atoms or with n-type dopant atoms, or the material may be substantially undoped (intrinsic). The dopant concentration of the semiconductor substrate 10 may be from $1.0 \times 10^{15}/cm^3$ to $1.0 \times 10^{19}/cm^3$, and typically from $1.0 \times 10^{16}$ cm$^3$ to $3.0 \times 10^{18}/cm^3$, although lesser and greater dopant concentrations are contemplated herein also. The semiconductor substrate 10 can be single crystalline and may be a bulk substrate, a semiconductor-on-insulator (SOI) substrate, or a hybrid substrate. While the present invention is described with a bulk substrate, implementation of the present invention on an SOI substrate or on a hybrid substrate is explicitly contemplated herein. Shallow trench isolation structure (not shown) can be present and can comprise a dielectric material such as silicon oxide or silicon nitride and can be formed by methods well known in the art.

Described is a process flow suitable for fabricating a vertical n-type field effect transistor (nFET) having an asymmetric gate structure. The process flow is applicable as well to fabrication of a p-type FET (pFET) with certain modifications detailed below.

Upon the substrate 10 is formed by epitaxial growth, with in-situ doping if desired, of a plurality of layers that will subsequently be differentiated (FIG. 2) as a source contact 12, an n+ Si source region 14, a p-type Si channel region 16, an n+ Si drain region 18, followed by deposition of a SiO2 hardmask (HM) 20. The source contact 12 can be, for example, an n++ doped region of the Si substrate 10 and can have an exemplary thickness in a range of about 10 nm to about 200 nm. The source contact 12 can also be a metal-containing layer comprised of a contact area (CA) metal such as tungsten (W) in combination with a layer of copper (Cu), or it may be only tungsten. The n+ Si source region 14 can be doped n-type with, for example, P or As at a concentration in a range of about $4 \times 10^{20}$ (and lower) to about $5 \times 10^{20}$ (and higher), and can have an exemplary thickness in a range of about 10 nm to about 200 nm. The p type Si channel region 16 can be doped p-type with, for example, B or Al at a concentration in a range of about $10^{16}$ (and lower) to about $10^{19}$ (and higher), and can have an exemplary thickness in a range of about 10 nm to about 40 nm. The n+ Si drain region 18 can be doped n-type with, for example, P or As at a concentration in a range of about $4 \times 10^{20}$ (and lower) to about $5 \times 10^{20}$ (and higher), and can have an exemplary thickness in a range of about 10 nm to about 200 nm. The SiO2 hardmask (HM) 20 can have a thickness in a range of about 2 nm to about 50 nm.

Figure 2:
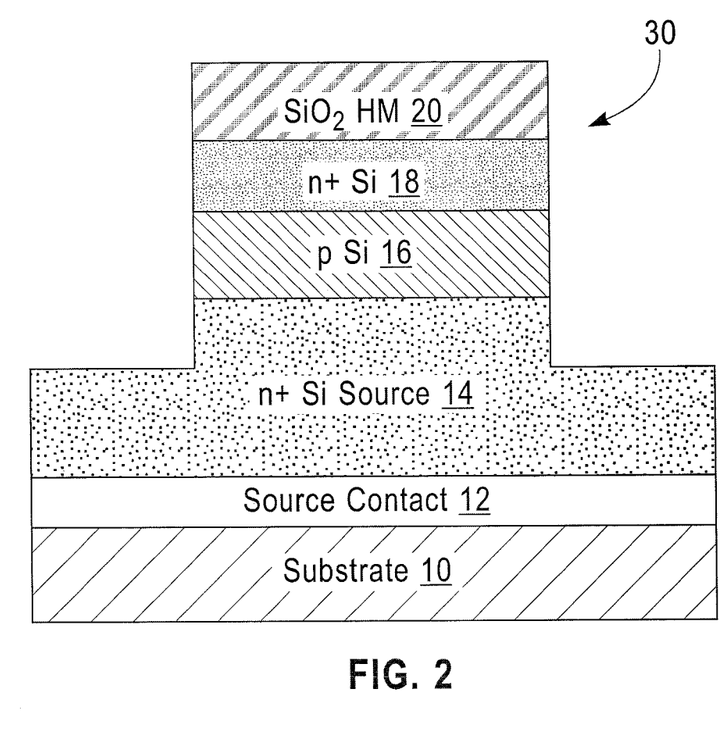

FIG. 2 is a cross-sectional view of the stack of material layers after a reactive ion etch (RIE) procedure is performed. The RIE procedure results in the formation of a pillar or column containing a portion of the n+ Si source region 14, the p-type Si channel region 16, the n+ Si drain region 18 and the overlying SiO2 hardmask 20. The pillar or column can be referred to as a precursor to the eventual transistor structure 30 and can have any desired diameter, such as a diameter in the range of about 50 nm or less to 100 nm or greater. As can be appreciated, during the RIE process any desired number of identical precursor transistor structures 30 can be formed over the substrate 10.

Figure 3:
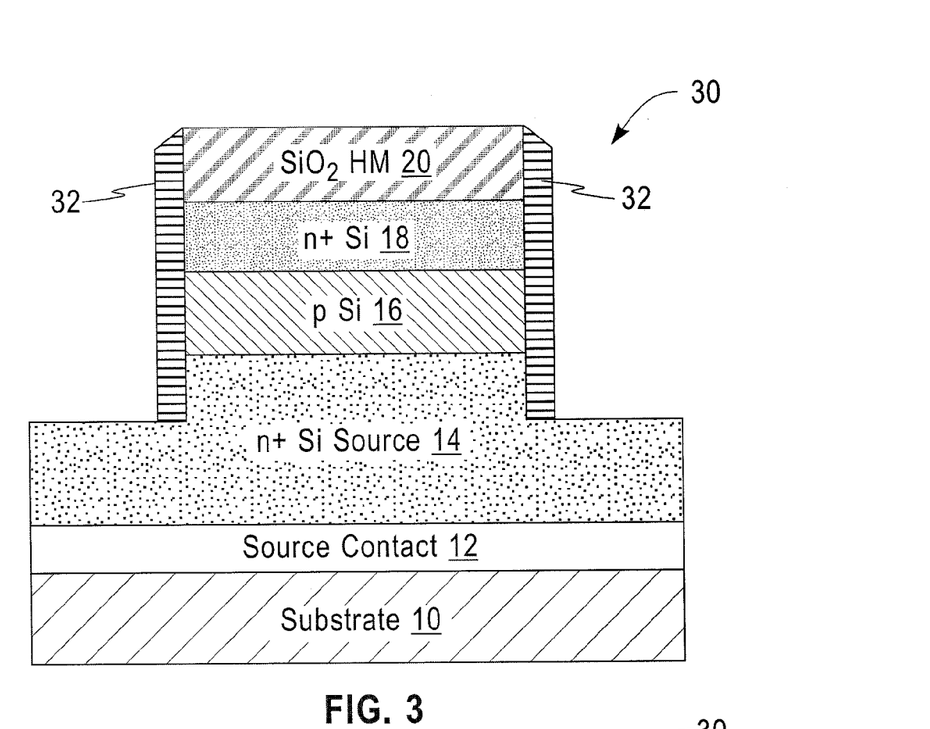

FIG. 3 is a cross-sectional view of the precursor transistor structure 30 after a spacer 32 is formed on the sidewalls thereof. The spacer can be, for example, SiN and can have a thickness of, for example, about 3 nm and greater. As will be noted below, the spacer 32 is a sacrificial structure and is removed in the process shown in FIG. 5.

Figure 4:
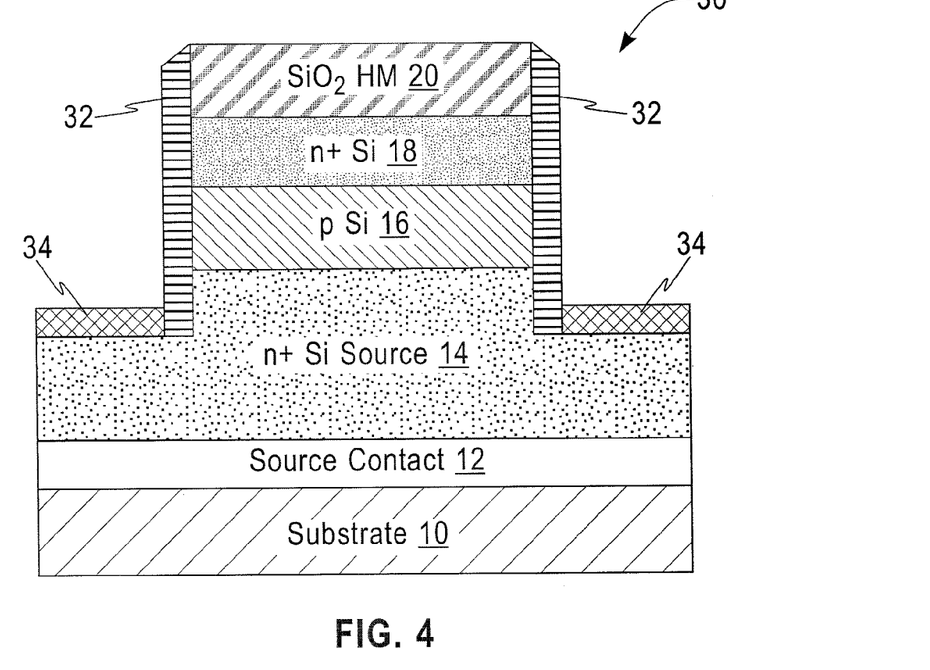

FIG. 4 shows an optional step of performing a thermal oxidation process that forms an oxide layer 34 (SiO2) over the exposed material of the n+ Si source region 14. The oxide layer 34 can have a thickness of about 10 nm and greater. One benefit of forming the oxide layer 34 is that it can function to reduce parasitic capacitance between the gate and source of the completed transistor.

Figure 5:
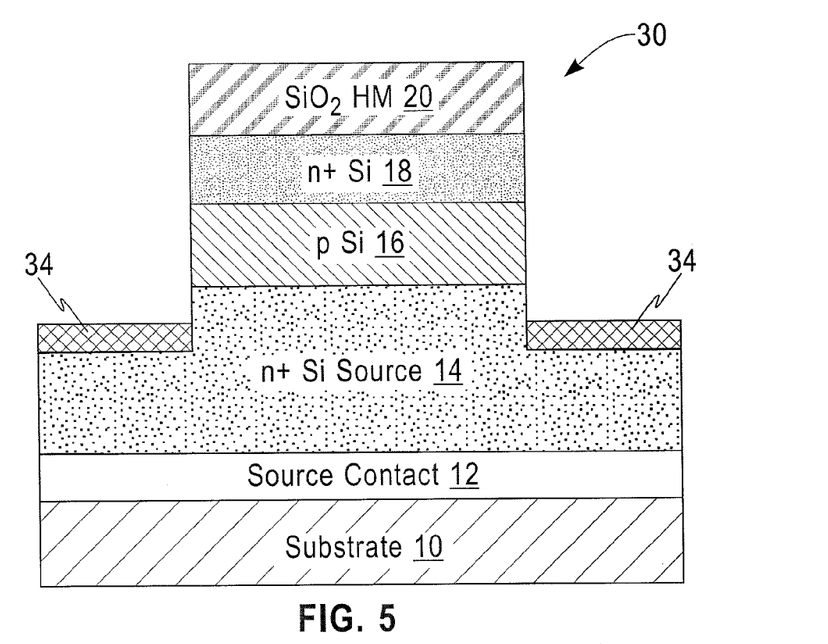

FIG. 5 shows the structure 30 after removal of the SiN spacer 32. The SiN spacer 32 can be removed by a chemical wet etch, such as one using hot phosphoric acid ($H_3PO_4$) or one using hydrofluoric acid (HF).

Note that if oxide layer 34 is not used then the processing shown in FIGS. 3, 4 and 5 may be considered as being optional.

Figure 6:
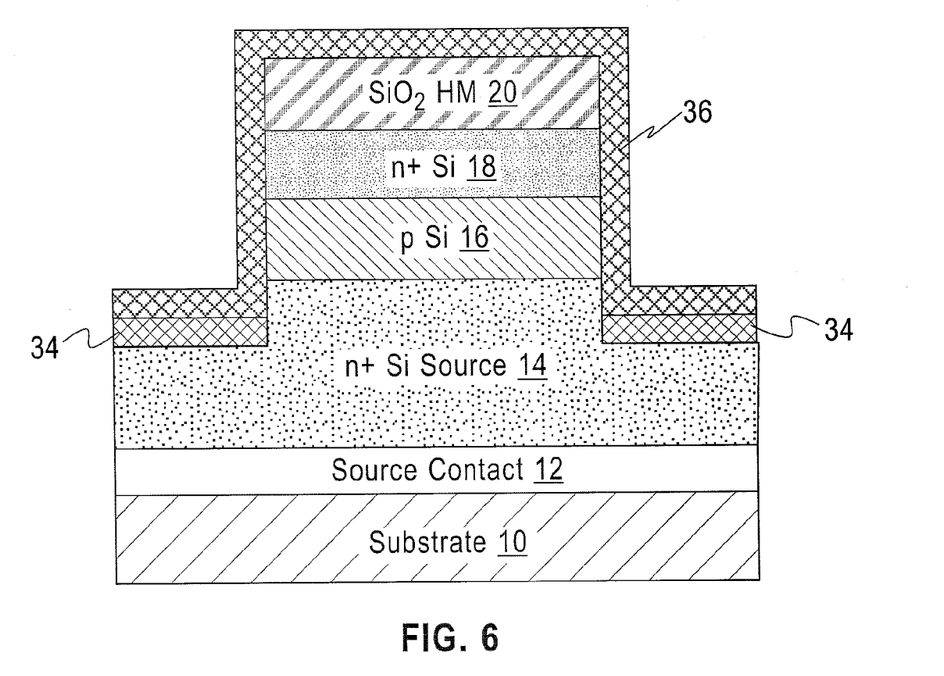

FIG. 6 shows a result of a process to form a layer of gate dielectric 36. Any suitable gate dielectric material may be used including $SiO_2$ or SiON (silicon oxi-nitride), however it can be preferred to use a high dielectric constant material (high-k material) such as one comprising a dielectric metal oxide having a dielectric constant that is greater than the dielectric constant of silicon nitride (7.5). The high-k dielectric layer 36 may be formed by known methods such as chemical vapor deposition (CVD), atomic layer deposition (ALD), molecular beam deposition (MBD), pulsed laser deposition (PLD), liquid source misted chemical deposition (LSMCD), etc. The dielectric metal oxide comprises a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the high-k gate dielectric layer 36 may be from 1 nm to 10 nm and may have an effective oxide thickness (EOT) on the order of, or greater than, about 5 Å.

Figure 7:
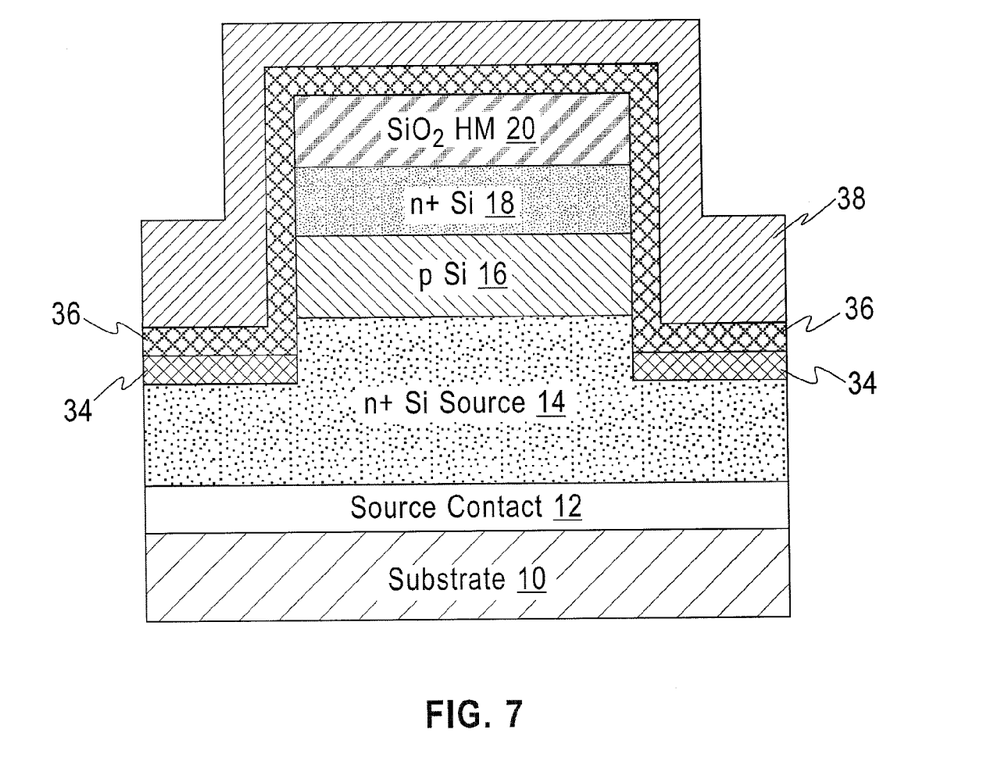

FIGS. 7 through-11 show, in accordance with embodiments of this invention, the formation of an asymmetric gate around the vertically disposed channel 16. The channel 16 has a channel length that is equivalent to the thickness of the p Si layer 16 (e.g., in the range of about 10 nm to about 40 nm), where the channel length dimension is perpendicular to the surface of the substrate 10. In the illustrated embodiment about 50% of the channel length is surrounded by a first metal gate conducting material layer 38 and the remaining about 50% of the channel length is surrounded by a second metal gate conducting material layer 40, where the first metal gate conducting material layer 38 has a higher work function (WF) than the second metal gate conducting material layer 40. As an example, the WF of the first metal gate conducting material layer 38 may be about 5.1 eV, while the WF of the second metal gate conducting material layer 40 may be about 4.1 eV. As non-limiting examples the first metal gate conducting material layer 38 may be comprised of W and the second metal gate conducting material layer 40 may be comprised of TiN or Al, each being deposited using plasma vapor deposition (PVD) or ALD or CVD. In the nFET embodiment depicted herein the metal gate conducting material having the higher WF is located closer to the source, while the metal gate conducting material having the lower WF is located closer to the drain. In a pFET embodiment, in addition to changing the dopant types, the ordering of the gate metal is reversed such that the metal gate conducting material having the higher WF is located closer to the drain, while the metal gate conducting material having the lower WF is located closer to the source. Note that in other embodiments the 50-50 channel coverage ratio of the metal gate conducting material having the higher WF and the metal gate conducting material having the lower WF can be adjusted so as to be other than a 50-50 coverage ratio. In all embodiments it is desirable that the entire length of the channel be surrounded by the metal gate conducting material having the higher WF and the metal gate conducting material having the lower WF.

The gate is considered as being asymmetric at least due to the presence of the gate conductor having at least two different work functions located at different spatial locations along the length of the channel.

It should be appreciated that while described herein as using two different types of gate conductor material each having an associated and different work function, the embodiments of this invention also encompass the use of more than two different types of gate conductor material each having an associated and different work function.

In light of the foregoing FIG. 7 shows a result of a blanket deposition of the first metal gate conducting material layer 38 (having the higher WF in this example) over the gate dielectric 36.

Figure 8:
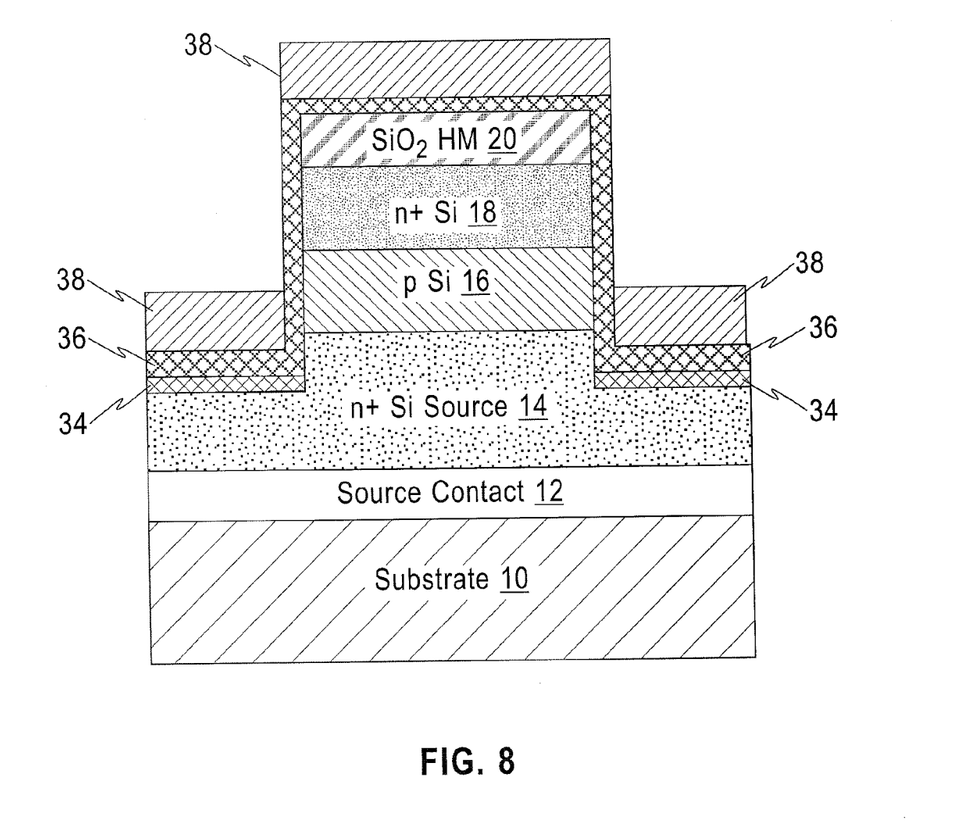

FIG. 8 shows a result of a selective removal of the first metal gate conducting material layer 38 from the sidewalls of the precursor transistor structure. This step also reduces the thickness of the first metal gate conducting material layer 38 so that it surrounds approximately 50% of the thickness of the p-Si channel layer 16 (i.e., the first metal gate conducting material layer 38 surrounds about 50% of the vertical channel length).

Figure 9:
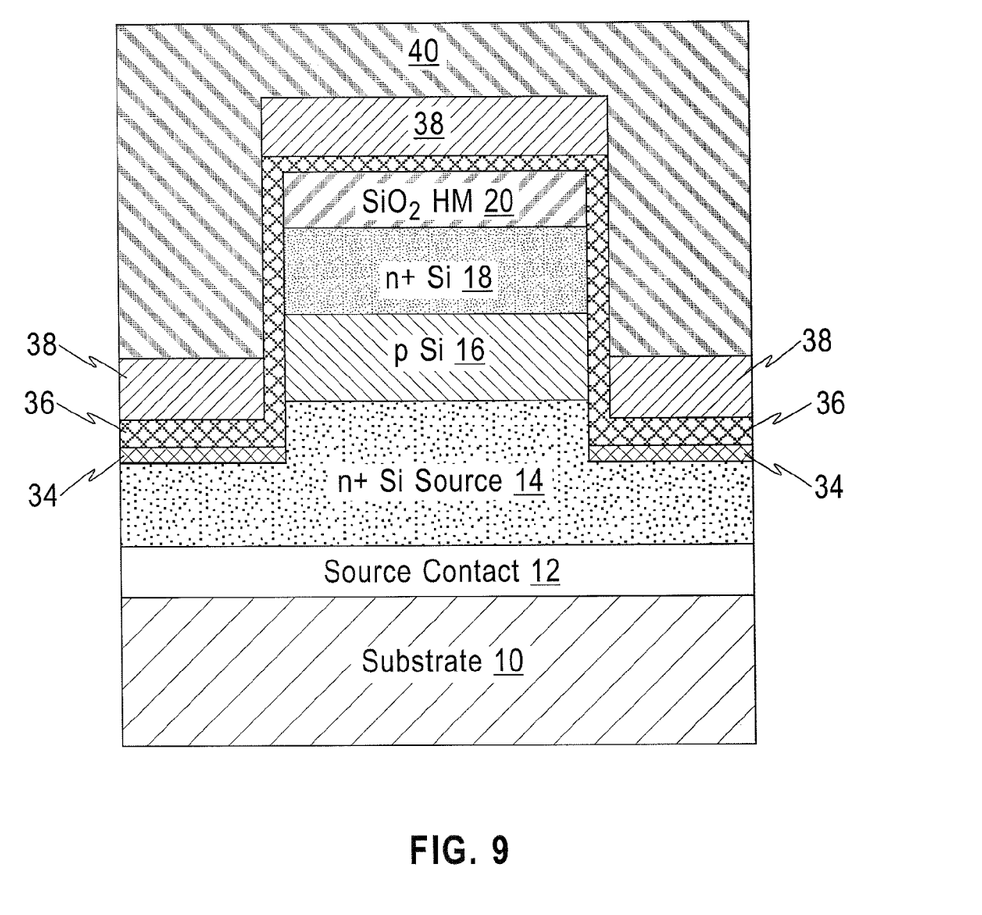

FIG. 9 shows a result of a blanket deposition of the second metal gate conducting material layer 40 (having the lower WF in this example) over the remaining first metal gate conducting material layer 38 and over the upper exposed portion of the gate dielectric 36.

Figure 10:
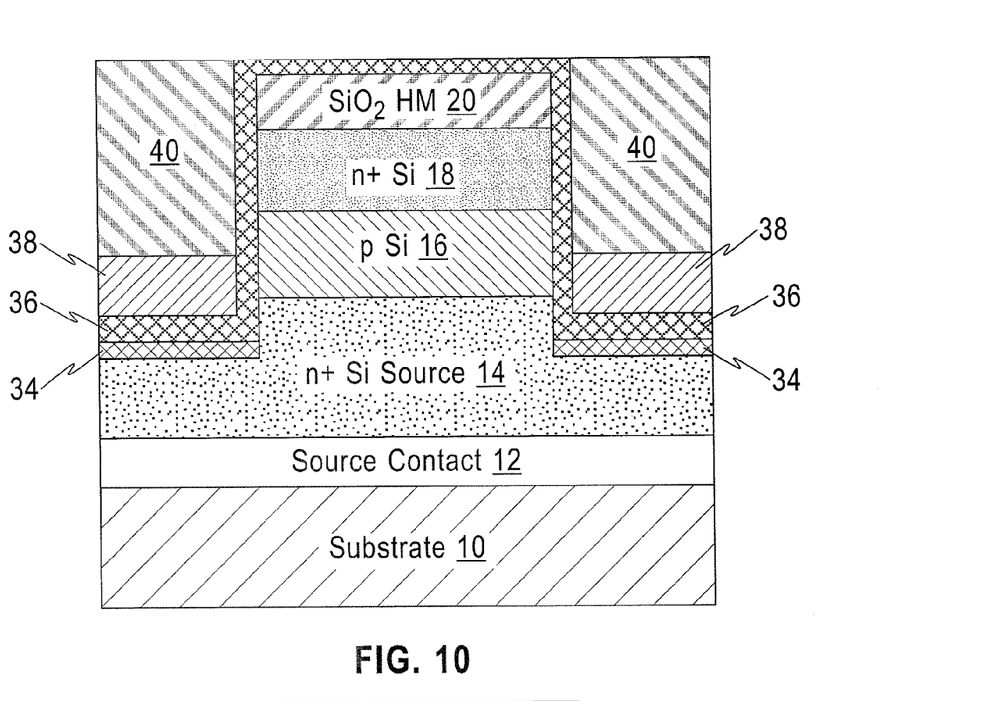

FIG. 10 shows a result of a performance of a chemical mechanical polish (CMP) process. The layer of gate dielectric material 36 disposed over the HM 20 functions as a stop layer for the CMP process.

Figure 11:
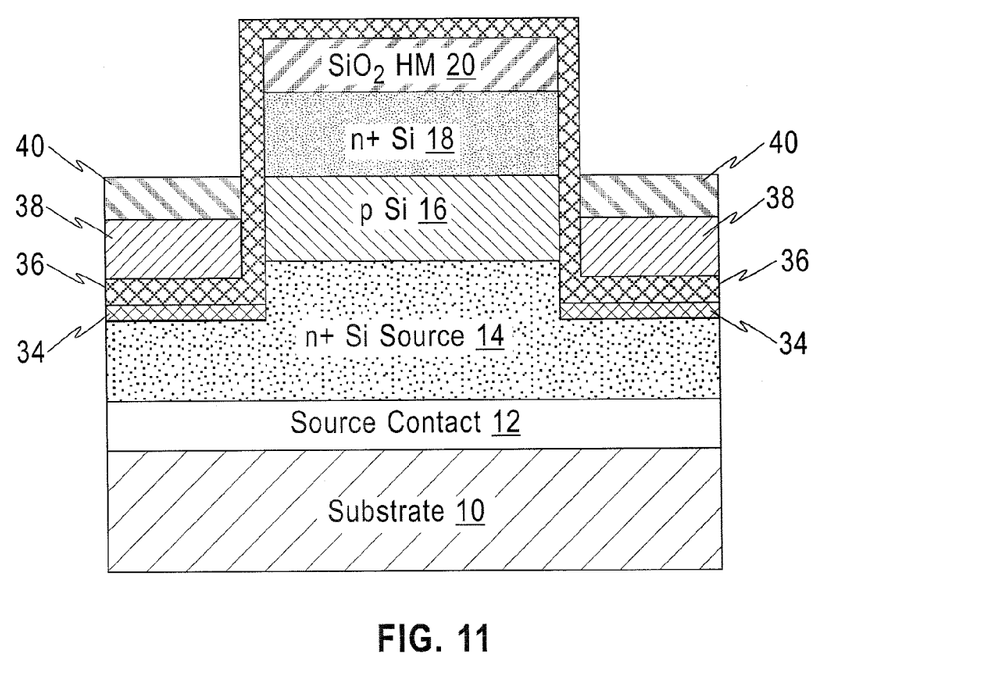

FIG. 11 shows a result of metal gate recess etch process (e.g., a reactive ion etch (RIE) process) that serves to reduce the thickness of the second metal gate conducting material layer 40 so that it at least covers and surrounds the upper portion of the p-type Si channel layer 16 (i.e., the second metal gate conducting material layer 38 surrounds the remaining 50% of the vertical channel length). As a result the nominally lower 50% of the thickness of the channel layer 16 is surrounded by the first metal gate conducting material layer 38 while the nominally upper 50% of the thickness of the channel layer 16 is surrounded by the second metal gate conducting material layer 40.

Figure 12:
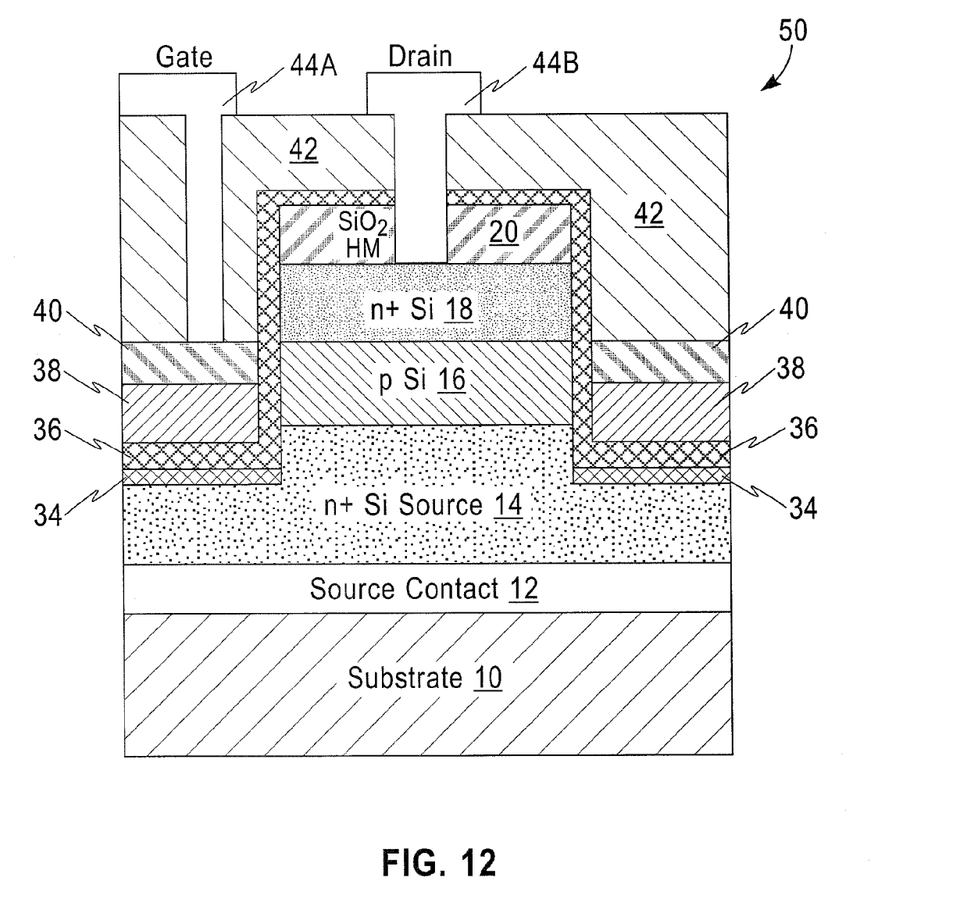

FIG. 12 shows an nFET transistor structure 50 formed as a result of undoped silicate glass (USG) processing, patterning and via formation to fabricate a gate contact 44A and a drain contact 44B. A source contact (not shown) can also be formed to contact the source contact layer 12. The layer 42 may be dielectric layer comprised of SiN, and the gate and drain contacts 44A, 44B may be W or a combination of W and Cu, as non-limiting examples. The gate contact area metal may be Cu only, while the drain contact area metal may be W that lies beneath a layer of Cu to physically isolate the Cu from the semiconductor material. The gate contact 44A is electrically connected to the second metal gate conducting material layer 40 that in turn is electrically connected to the first metal gate conducting material layer 38.

Figure 13A:
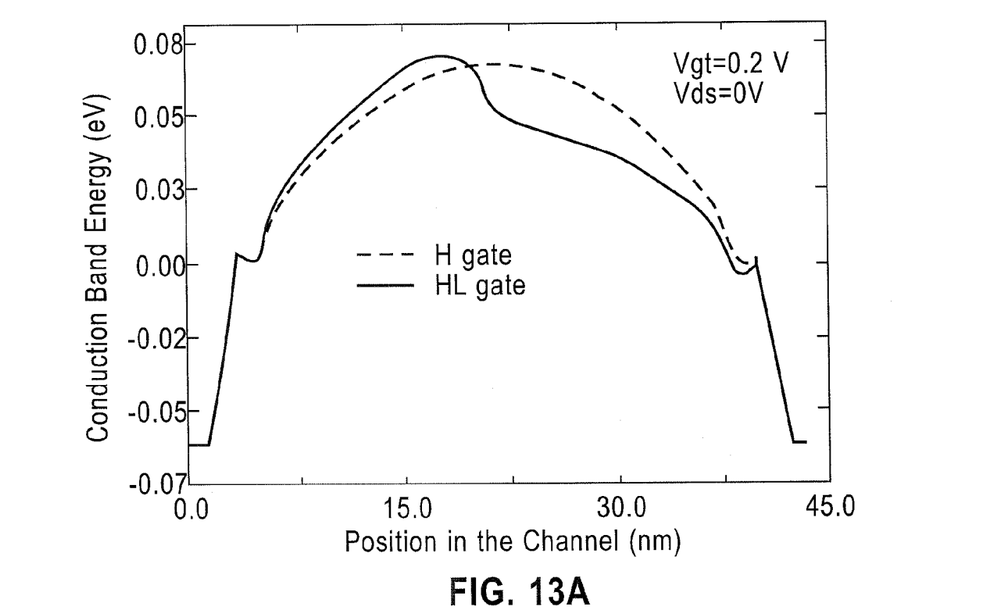
FIGS. 13A and 13B are graphs that illustrate that the asymmetric gate device (referred to as a HL gate) in accordance with the embodiments of this invention has a higher electric field at a source injection area in the channel, as compared to a conventional device having a single work function gate conductor along the length of channel (referred to as an H gate).
Figure 13B:
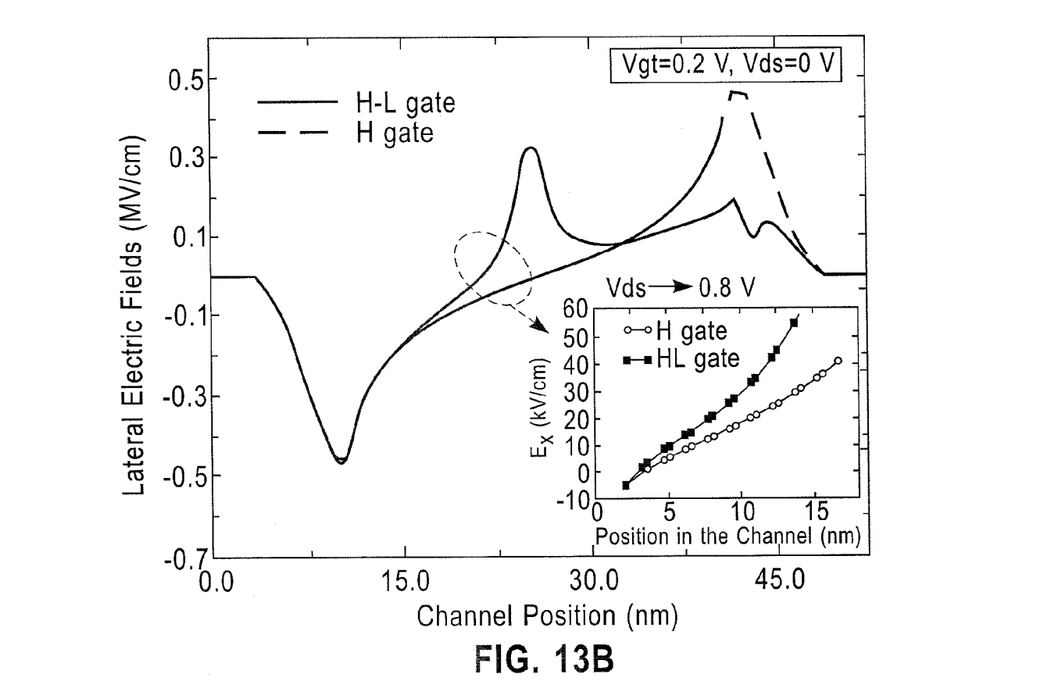

FIG. 13, composed of graphs 13A and 13B, illustrates that the asymmetric gate device (referred to as a HL gate) in accordance with the embodiments of this invention has a higher electric field at the source injection area in the channel, as compared to a conventional device having a single work function gate conductor along the length of channel (referred to as an H gate).

Figure 14:
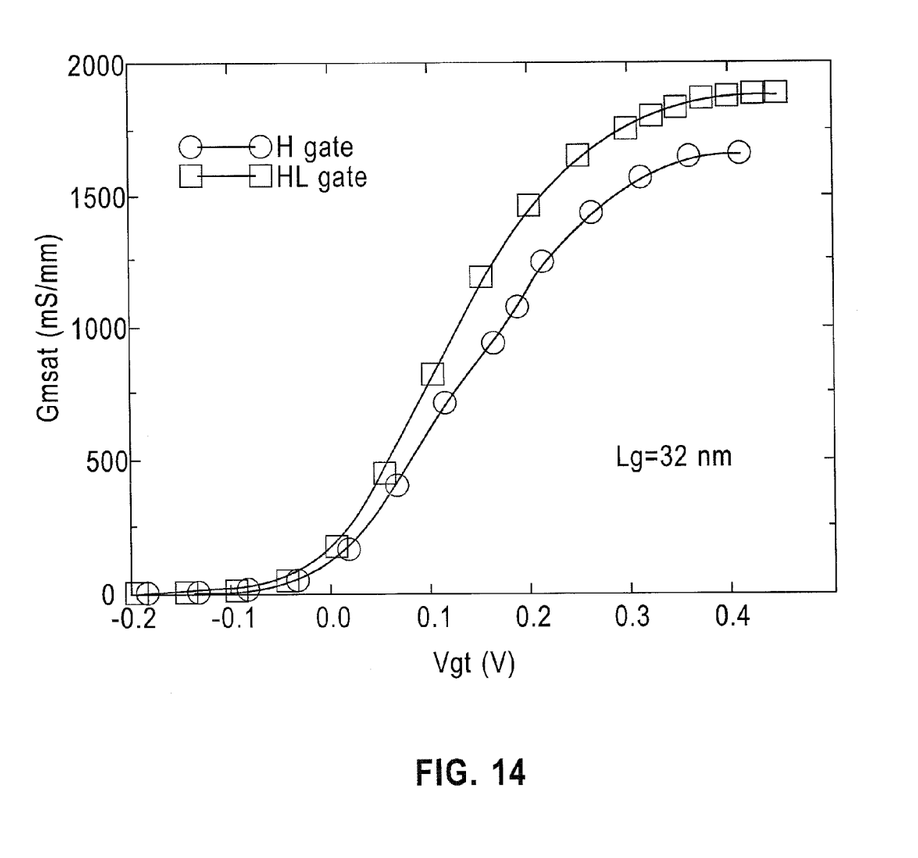
FIG. 14 is a graph that illustrates an approximately 15%-20% improvement in device performance of the HL gate device as compared to the conventional H gate device having the uniform single work function gate conductor along the length of channel.

FIG. 14 illustrates an approximately 15%-20% improvement in device performance of the HL gate device as compared to the conventional H gate having the uniform single work function gate conductor along the length of channel (e.g., 32 nm).

It should be pointed out that the locations of the source and drain can be reversed (i.e., drain at the bottom and the source at the top of device). If the locations of the source and drain are reversed the work function metal is also reversed in order to have, e.g., for the nFET embodiment, the high work function metal close to the source side and the low work function metal close to drain side.

It is also pointed out that the thicknesses of the source and drain need not be the same.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents thereof are intended to include, for example, any structure, material, layer thicknesses and layer compositions, feature dimensions and processing modes (e.g., etching modes) for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. For example, the various materials, thicknesses, work functions and fabrication equipment and techniques are non-limiting examples, and can be varied from those specifically disclosed herein. The embodiments were chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent mathematical expressions may be used by those skilled in the art. However, all such and similar modifications of the teachings of this invention will still fall within the scope of this invention.

What is claimed is:

1. A method to fabricate a transistor structure, comprising:
providing a substrate;
forming by epitaxial growth upon a surface of said substrate a three layer stack structure comprised of a source comprised of a first layer of semiconductor material, a drain comprised o fa second layer of semiconductor material and a channel that is disposed vertically between said source and said drain, said channel being comprised of a third layer of semiconductor material disposed above and perpendicular with respect to said surface of said substrate between a first surface of said first layer of semiconductor material of said source and a first surface of said second layer of semiconductor material of said drain;
forming a gate dielectric layer over at least sidewalls of said channel; and
forming a gate conductor that surrounds said channel and said gate dielectric layer, where said gate conductor is formed so as to comprise a first layer of first electrically conductive material having a first work function that surrounds a first portion of a length of said channel and a second layer of second electrically conductive material having a second work function that surrounds a second portion of the length of said channel, where said first layer of first electrically conductive material and said second layer of second electrically conductive material are disposed vertically adjacent to one another, relative to the surface of said substrate, one above the other and together surround the length of said channel, the method further comprising,
forming a layer of dielectric material having a bottom surface disposed on and overlying a second surface of one of said first layer of semiconductor material or said second layer of semiconductor material in dependence on whether said source or said drain is disposed vertically above the channel, where said layer of gate dielectric material is disposed on a top surface of said layer of dielectric material and on side surfaces of said layer of dielectric material, and
forming an electrical contact through a portion of said layer of gate dielectric material that is disposed on the top surface of said layer of dielectric material, said electrical contact also being formed through said layer of dielectric material;
the step of forming the gate conductor comprising
blanket depositing the first electrically conductive material so as to surround said channel and said gate dielectric layer that is disposed on the sidewalls of said channel;
selectively removing a portion of the first electrically conductive material so that a remaining thickness of the first electrically conductive material comprises the first layer of first electrically conductive material that surrounds a lower, first length of the channel, where selectively removing exposes a portion of said gate dielectric layer that is disposed on an upper, second length of said channel and exposes a top surface of the first layer of first electrically conductive material;
blanket depositing the second electrically conductive material on the exposed top surface of the first layer of first electrically conductive material so as to cover the first layer of first electrically conductive material and to surround the exposed portion of said gate dielectric layer that is disposed on the upper, second length of said channel; and
selectively removing a portion of the second electrically conductive material so that a remaining thickness of said second electrically conductive material comprises the second layer of the second electrically conductive material that surrounds the second length of the channel.

2. The method as in claim 1, where the first and the second portion of the length are each about 50% of the length of the channel.

3. The method as in claim 1, where said first work function is about 5.1 eV, and where said second work function is about 4.1 eV.

4. The method as in claim 1, where the transistor is an n-type of field effect transistor, and where said first layer of first electrically conductive material has a work function that is greater than a work function of said second layer of second electrically conductive material and is formed so as to be disposed nearer to said source than said second layer of second electrically conductive material.

5. The method as in claim 1, where the transistor is a p-type of field effect transistor, and where said first layer of first electrically conductive material has a work function that is greater than a work function of said second and is formed so as to be disposed nearer to said drain than said second layer of second electrically conductive material.

6. The method as in claim 1, where said gate dielectric material is formed so as to be comprised of $SiO_2$ or SiON.

7. The method as in claim 1, where said gate dielectric material is formed to be comprised of a high dielectric constant material comprised of at least one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof, where each value of x is independently from 0.5 to 3 and each value of y is independently from 0 to 2.

8. The method as in claim 1, where the length of said channel is about 40 nm or less.

9. The method as in claim 1, where said first layer of first electrically conductive material having the first work function is comprised of tungsten, and where said second layer of second electrically conductive material is comprised of one of tungsten nitride or aluminum.

10. The method as in claim 1, further comprising an initial step of forming a source contact layer so as to be interposed between said first layer of semiconductor material and said surface of said substrate.

11. The method as in claim 1, where the lower, first length of the channel and the upper, second length of the channel are each about 50% of the length of the channel.

12. A method to fabricate a transistor structure, comprising:
providing a substrate;
forming by epitaxial growth upon a surface of said substrate a three layer stack structure comprised of a source comprised of a first layer of semiconductor material, a drain comprised of a second layer of semiconductor material and a channel that is disposed vertically between said source and said drain, said channel being comprised of a third layer of semiconductor material disposed above and perpendicular with respect to said surface of said substrate between a first surface of said first layer of semiconductor material of said source and a first surface of said second layer of semiconductor material of said drain;
forming a gate dielectric layer over at least sidewalls of said channel; and
forming a gate conductor that surrounds said channel and said gate dielectric layer, where said gate conductor is formed so as to comprise a first layer of first electrically conductive material having a first work function that surrounds a first portion of a length of said channel and a second layer of second electrically conductive material having a second work function that surrounds a second portion of the length of said channel, where said first layer of first electrically conductive material and said second layer of second electrically conductive material are disposed vertically adjacent to one, relative to the surface of said substrate, another one above the other and together surround the length of said channel, the step of forming the gate conductor further comprising, blanket depositing the first electrically conductive material so as to surround said channel and said gate dielectric layer that is disposed on the sidewalls of said channel;

selectively removing a portion of the first electrically conductive material so that a remaining thickness of the first electrically conductive material comprises the first layer of first electrically conductive material that surrounds a lower, first length of the channel, where selectively removing exposes a portion of said gate dielectric layer that is disposed on an upper, second length of said channel and exposes a top surface of the first layer of first electrically conductive material;

blanket depositing the second electrically conductive material on the exposed top surface of the first layer of first electrically conductive material so as to cover the first layer of first electrically conductive material and to surround the exposed portion of said gate dielectric layer that is disposed on the upper, second length of said channel; and selectively removing a portion of the second electrically conductive material so that a remaining thickness of said second electrically conductive material comprises the second layer of the second electrically conductive material that surrounds the second length of the channel.

13. The method as in claim 12, where the lower, first length of the channel and the upper, second length of the channel are each about 50% of the length of the channel.

14. The method as in claim 12, further comprising:

forming a layer of dielectric material having a bottom surface disposed on and overlying a second surface of one of said first layer of semiconductor material or said second layer of semiconductor material in dependence on whether said source or said drain is disposed vertically above the channel, where said layer of gate dielectric material is disposed on a top surface of said layer of dielectric material and on side surfaces of said layer of dielectric material, and forming an electrical contact through a portion of said layer of gate dielectric material that is disposed on the top surface of said layer of dielectric material, said electrical contact also being formed through said layer of dielectric material.

15. The method as in claim 12, where the first work function is about 5.1 eV, and where the second work function is about 4.1 eV.

16. The method as in claim 12, where the transistor is an n-type of field effect transistor, and where said first layer of first electrically conductive material has a work function that is greater than a work function of said second layer of second electrically conductive material and is formed so as to be disposed nearer to said source than said second layer of second electrically conductive material.

17. The method as in claim 12, where the transistor is a p-type of field effect transistor, and where said first layer of first electrically conductive material has a work function that is greater than a work function o f said second layer of second electrically conductive material and is formed so as to be disposed nearer to said drain than said second layer of second electrically conductive material.

18. The method as in claim 12, where said gate dielectric material is formed so as to be comprised of $SiO_2$ or SiON or a high dielectric constant material comprised of at least one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof, where each value of x is independently from 0.5 to 3 and each value of y is independently from 0 to 2.

19. The method as in claim 12, further comprising an initial step of forming a contact layer so as to be interposed between said first layer of semiconductor material and said surface of said substrate, said contact layer being conductively coupled to said first layer of semiconductor material.

* * * * *